United States Patent
Dabby et al.

(10) Patent No.: US 10,215,164 B2
(45) Date of Patent: Feb. 26, 2019

(54) FABRIC-BASED PIEZOELECTRIC ENERGY HARVESTING

(71) Applicant: Intel Corporation, Santa Clara, CA (US)

(72) Inventors: Nadine L. Dabby, Palo Alto, CA (US); Feras Eid, Chandler, AZ (US); Adel A. Elsherbini, Chandler, AZ (US); Braxton Lathrop, Lake Oswego, OR (US); Aleksandar Aleksov, Chandler, AZ (US); Sasha Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 513 days.

(21) Appl. No.: 14/961,116

(22) Filed: Dec. 7, 2015

(65) Prior Publication Data

US 2017/0163178 A1 Jun. 8, 2017

(51) Int. Cl.
- *H01L 41/113* (2006.01)
- *F03G 5/08* (2006.01)
- *H02N 2/18* (2006.01)

(52) U.S. Cl.
CPC .............. *F03G 5/08* (2013.01); *H01L 41/113* (2013.01); *H02N 2/18* (2013.01)

(58) Field of Classification Search
CPC ............ F03G 5/08; H01L 41/113; H02N 2/18
(Continued)

(56) References Cited

U.S. PATENT DOCUMENTS

| | | | | |
|---|---|---|---|---|
| 5,500,635 A | * | 3/1996 | Mott | A43B 1/0072 310/311 |
| 5,857,694 A | * | 1/1999 | Lazarus | A63C 5/075 280/601 |

(Continued)

FOREIGN PATENT DOCUMENTS

| CN | 108366733 A | 8/2018 |
|---|---|---|
| KR | 1020150004819 A | 1/2015 |

(Continued)

OTHER PUBLICATIONS

U.S. Appl. No. 14/971,800, filed Dec. 16, 2015, Physiological Characteristic Measurement System.
(Continued)

*Primary Examiner* — Thomas Dougherty
(74) *Attorney, Agent, or Firm* — Schwegman Lundberg & Woessner, P.A.

(57) ABSTRACT

A device for harvesting energy from fabric or clothing includes a piece of fabric or clothing. One or more piezoelectric harvesters are coupled with the piece of fabric or clothing. The piezoelectric harvesters are capable of producing electric energy in response to the movement of the piece of fabric or clothing. Additionally, the device includes one or more energy storage mediums coupled to the one or more piezoelectric harvesters. The energy storage mediums are capable of storing the energy produced by the one or more piezoelectric harvesters. Further, the method for harvesting energy from fabric or clothing involves moving a piece of fabric such that one or more piezoelectric harvesters generate electricity. The method for harvesting energy from fabric or clothing also involves storing the generated electricity in one or more energy storage mediums.

19 Claims, 3 Drawing Sheets

(58) Field of Classification Search
USPC .......................................................... 310/339
See application file for complete search history.

(56) References Cited

U.S. PATENT DOCUMENTS

| | | | |
|---|---|---|---|
| 6,433,465 B1* | 8/2002 | McKnight | A43B 3/0005 |
| | | | 310/319 |
| 6,487,906 B1 | 12/2002 | Hock | |
| 6,701,296 B1 | 3/2004 | Kramer | |
| 6,876,135 B2* | 4/2005 | Pelrine | A43B 3/0005 |
| | | | 310/317 |
| 7,304,416 B2* | 12/2007 | Mullen | A43B 3/00 |
| | | | 310/331 |
| 8,948,839 B1 | 2/2015 | Longinotti-buitoni et al. | |
| 2006/0224214 A1* | 10/2006 | Koller | A61F 6/04 |
| | | | 607/62 |
| 2010/0010379 A1 | 1/2010 | De Rossi et al. | |
| 2012/0055257 A1* | 3/2012 | Shaw-Klein | H01L 41/081 |
| | | | 73/780 |
| 2013/0119255 A1 | 5/2013 | Dickinson et al. | |
| 2015/0033801 A1 | 2/2015 | Finzelberg | |
| 2015/0177080 A1 | 6/2015 | Esposito et al. | |
| 2015/0182131 A1 | 7/2015 | Mahfouz et al. | |
| 2016/0081585 A1 | 3/2016 | Halter | |
| 2016/0181823 A1* | 6/2016 | Durham | G06F 1/163 |
| | | | 307/104 |
| 2017/0156636 A1* | 6/2017 | Kawamura | A61B 5/11 |
| 2017/0172421 A1 | 6/2017 | Dabby et al. | |
| 2017/0201099 A1* | 7/2017 | Savanth | H02J 17/00 |

FOREIGN PATENT DOCUMENTS

| | | |
|---|---|---|
| KR | 101524248 B1 | 5/2015 |
| WO | WO-2017105697 A1 | 6/2017 |

OTHER PUBLICATIONS

"U.S. Appl. No. 14/971,800, Non Final Office Action dated May 29, 2018", 13 pgs.

"International Application Serial No. PCT/US2016/061600, International Preliminary Report on Patentability dated Jun. 28, 2018", 11 pgs.

"International Application Serial No. PCT/US2016/061600, International Search Report dated Jan. 10, 2017", 3 pgs.

"International Application Serial No. PCT/US2016/061600, Written Opinion dated Jan. 10, 2017", 9 pgs.

"Nanopaint—Design Your Technology: Electroactive inks and solutions for flexible electronics", [Online]. Retrieved from the Internet: <URL: http://www.nanopaint-tech.com/>, (Accessed: Dec. 8, 2015), 10 pgs.

"StretchSense: Smart, Soft, Stretchable Sensors", [Online]. Retrieved from the Internet: <URL: http://stretchsense.com/>, (Accessed: Dec. 8, 2015), 5 pgs.

Lefort, M-H, et al., "Thick Film Piezoresistive Ink: Application to Pressure Sensors", The International Journal of Microcircuits and Electronic Packaging 23(2), (2000), 191-202.

Rausch, Jacqueline, "Printed piezoresistive strain sensors for monitoring of light-weight structures", Sensor+TEST Conferences—Sensor Proceedings: B1.3, (2011), 216-221.

"U.S. Appl. No. 14/971,800, filed Oct. 1, 2018 to Non Final Office Action dated May 29, 2018", 16 pgs.

* cited by examiner

US 10,215,164 B2

FABRIC-BASED PIEZOELECTRIC ENERGY HARVESTING

BACKGROUND

Fabric-based wearable electronics are very limited by the power required for the operation of the electronics. Current solutions involve using large, cumbersome, battery packs to provide the power necessary to operate the wearable electronics. The present subject matter can help provide a solution to this problem, such as by integrating piezoelectric harvesters with the fabric to provide power to the wearable electronic devices.

OVERVIEW

The present inventors have recognized, among other things, that a problem to be solved can include providing power to fabric-based wearable electronic devices in a compact and rechargeable manner. The present subject matter can help provide a solution to this problem, such as by using piezoelectric harvesters to convert the motion of the living organism into usable energy to either supplement the power demands or completely supply the power demands of a fabric-based wearable electronic device.

A device for harvesting energy from fabric or clothing includes a piece of fabric or clothing. One or more piezoelectric harvesters are coupled with the piece of fabric or clothing. The piezoelectric harvesters are capable of producing electric energy in response to the movement of the piece of fabric or clothing. Additionally, the device includes one or more energy storage mediums coupled to the one or more piezoelectric harvesters. The energy storage mediums are capable of storing the energy produced by the one or more piezoelectric harvesters. Further, the method for harvesting energy from fabric or clothing involves moving a piece of fabric such that one or more piezoelectric harvesters generate electricity. The method for harvesting energy from fabric or clothing also involves storing the generated electricity in one or more energy storage mediums.

This overview is intended to provide a summary of the subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
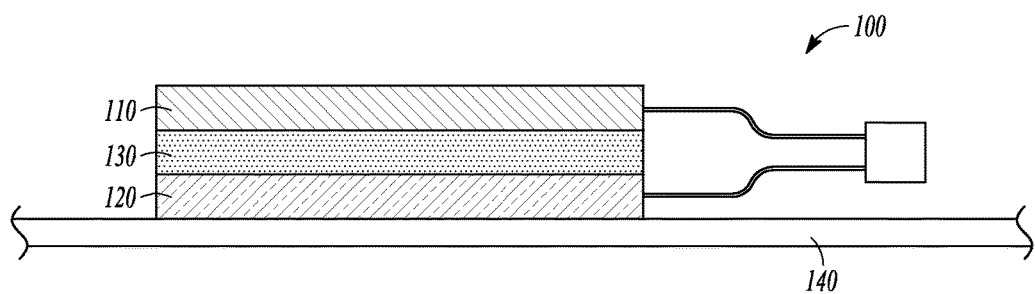
FIG. 1 is a side view of one example of a linear piezoelectric harvester.

FIG. 1 shows a side view of one example of a linear piezoelectric harvester 100 coupled to a piece of fabric 140. In an example, the linear piezoelectric harvester 100 includes a first electrode 110, a second electrode 120, and a piezoelectric material 130. The piezoelectric material 130 is located between (i.e., coupled with), and in electrical communication with, the first electrode 110 and the second electrode 120. The linear piezoelectric harvester 100 is a pressure transducer. Stated another way, the straining of the linear piezoelectric harvester 100 generates a voltage difference between the first electrode 110 and the second electrode 120. The voltage difference between the first electrode 110 and the second electrode 120 produces a current that can be used to provide power to an electric device (e.g., a fabric-based wearable electronic device). In one example, the piezoelectric material 130 is quartz crystals. In another example, the piezoelectric material 130 is a polymer such as polyvinylidene fluoride (PVDF). In yet another example, the piezoelectric material 130 is lead zirconate titanate (PZT) or barium titanate (BaTiO3). Alternatively or additionally, and as discussed further herein, the piezoelectric material 13 can be an ink. A linear piezoelectric harvester 100 is fabricated when a piezoelectric ink (e.g., lead zirconate titanate or sodium potassium niobate) is deposited on a substrate (e.g., the piece of fabric 140). Electrodes (e.g., the first and second electrode 110, 120) are then coupled to opposing sides of the area where the piezoelectric ink was deposited on the substrate (e.g., the piece of fabric 140). Alternatively or additionally, the electrodes (e.g., the first and second electrodes 110, 120) are fabricated through the application of an electrically conductive ink onto opposing sides of the area where the piezoelectric ink was deposited onto the substrate (e.g., the piece of fabric 140). In yet another example, the piezoelectric material 130 is any material that produces a voltage difference when deformed (i.e., strained) by an external force that is applied to the piezoelectric material 130.

Figure 2:
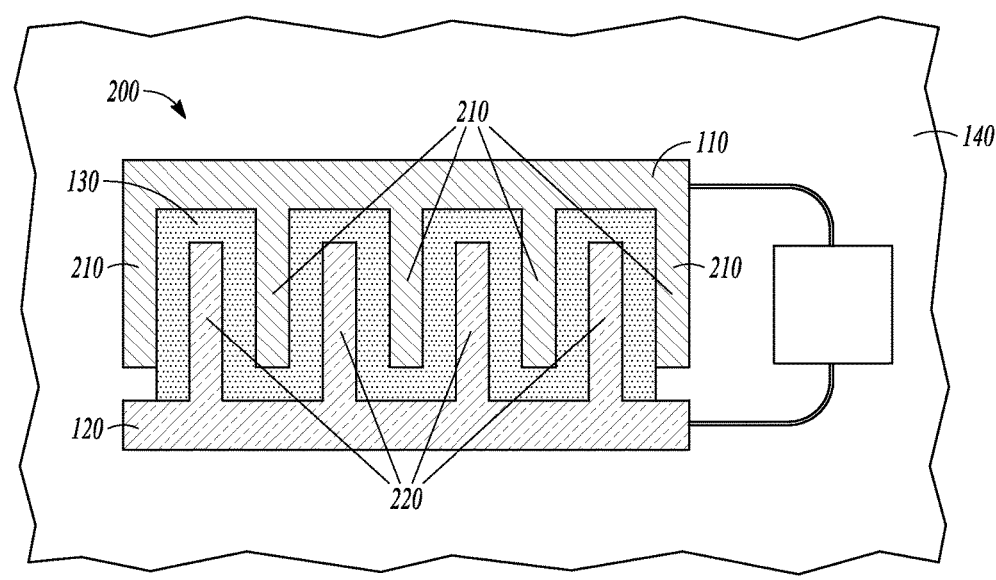
FIG. 2 is a top view of an example of a serpentine piezoelectric harvester.

FIG. 2 shows a top view of an example of a serpentine piezoelectric harvester 200 coupled to the piece of fabric 140. In an example, the first electrode 110 is sized and shaped such that the first electrode 110 has a series of first electrode projections 210. The second electrode 120 is also sized and shaped such that the second electrode has a series of second electrode projections 220. A void is located between each of the first electrode projections 210 and the second electrode projections, respectively. The first electrode projections 210 and the second electrode projections 220 interlock with one another such that the first electrode projections 210 project a distance into the void between the series of second electrode projections 220. Conversely, the second electrode projections 120 project a distance into the void between the first electrode projections 210. However, the first electrode 110 and the second electrode 120 are not in communication with one another. The piezoelectric material 130 is located in a layer underneath, and in communication with, the first electrode 110 and the second electrode 120 (and the first and second electrode projections 210, 220). When viewed from above, and as shown in FIG. 2, the piezoelectric material 130 substantially fill the voids between the first electrode 110 and the second electrode 120. Alternatively or additionally, the piezoelectric material 130 may extend underneath the entire bottom surface (not shown) of the first and second electrodes projections 210, 220 and be in electrical and physical communication with the bottom surfaces (not shown) of the electrode projections 210 and 220.

In another example, the differing arrangements between the linear piezoelectric harvester 100 and the serpentine piezoelectric harvester 200 results in electrical fields being generated in different directions. The electrical field being generated by the linear piezoelectric harvester 100, shown in FIG. 1, is perpendicular to the length of either the first electrode 110 or the second electrode 120. Stated another way, the electrical field being generated by the linear piezoelectric harvester 100, shown in FIG. 1, is directed perpendicular to the piece of fabric 140. The electrical field being generated by the serpentine piezoelectric harvester 200, shown in FIG. 2, is parallel to the plane of the first and second electrodes 110, 120. Stated another way, the electrical field generated by the serpentine piezoelectric harvester 200 is directed parallel to the piece of fabric 140.

The differing arrangements between the linear piezoelectric harvester 100 and the serpentine piezoelectric harvester 200 allows for the most efficient capture of the strain applied to the piece of fabric 140 (as discussed in further detail herein). In an example, the piece of fabric 140 is only strained longitudinally. The differing arrangements of the linear piezoelectric harvester 100 and the serpentine piezoelectric harvester 200 allow for either the linear piezoelectric harvester 100 or the serpentine piezoelectric harvester 200 to be coupled with the piece of fabric 140, and aligned with the longitudinal strain applied to the piece of fabric 140, such that either the linear piezoelectric harvester 100 or the serpentine piezoelectric harvester 200 experiences substantially the same amount of strain that is applied to the piece of fabric 140. This is in contrast to a linear piezoelectric harvester 100 or a serpentine piezoelectric harvester 200 that is not aligned with the longitudinal strain applied to the piece of fabric 140 wherein the linear piezoelectric harvester 100 or the serpentine piezoelectric harvester 200 does not experience strain that is substantially the same as the amount of strain that is applied to the piece of fabric 140.

Figure 3:
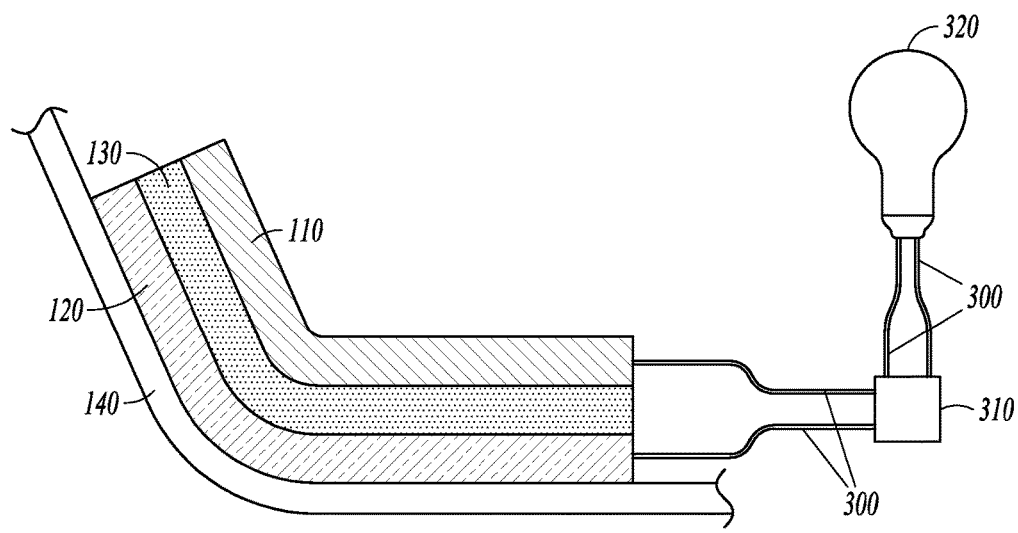
FIG. 3 is a side view of the linear piezoelectric harvester of FIG. 1, wherein the linear piezoelectric harvester is coupled to an elbow and is strained.

FIG. 3 is a perspective view of the linear piezoelectric harvester 100 of FIG. 1, wherein the linear piezoelectric harvester 100 is strained. In an example, the linear piezoelectric harvester 100 (and similarly the serpentine piezoelectric harvester 200) is strained such that it produces a voltage difference between the first electrode 110 and the second electrode 120. Conversely, the linear piezoelectric harvester 100 does not produce a voltage difference when it is not strained. As previously discussed herein, in an example, when the linear piezoelectric harvester 100 is strained, a voltage is produced between the first electrode 110 and the second electrode 120. In another example, the first and second electrode 110, 120 are coupled to, and in electrical communication with, one or more conductors 300. In yet another example, the voltage produced by the linear or serpentine piezoelectric harvester 100, 200 produces an electric current which is transmitted through the one or more conductors 300 and collected (i.e., stored or retained) in an energy storage medium 310. In an example, the energy storage medium 310 is a capacitor, battery, or the like. In yet another example, the first and second electrode 110, 120 are in electrical communication with conditioning circuitry (not shown). The conditioning circuitry (not shown) is in electrical communication with the energy storage medium 310 and can be used to optimize the charging of the energy storage medium 310.

In still yet another example, the energy storage medium 310 is in electrical communication with one or more electronic devices 320. The energy storage medium 310 is capable of transmitting the energy produced by either the linear or serpentine piezoelectric harvester 100, 200 to the one or more electronic devices 320. In an example, the one or more electronic devices 320 can include, but is not limited to, lights, LEDs, microphones, speakers, processors, memory, actuators, motors, transducers, touch screens, sensors, transmitters, receivers, transceivers, radios, electrical components (e.g., resistors, amplifiers, capacitors etc.), or the like.

Figure 4:
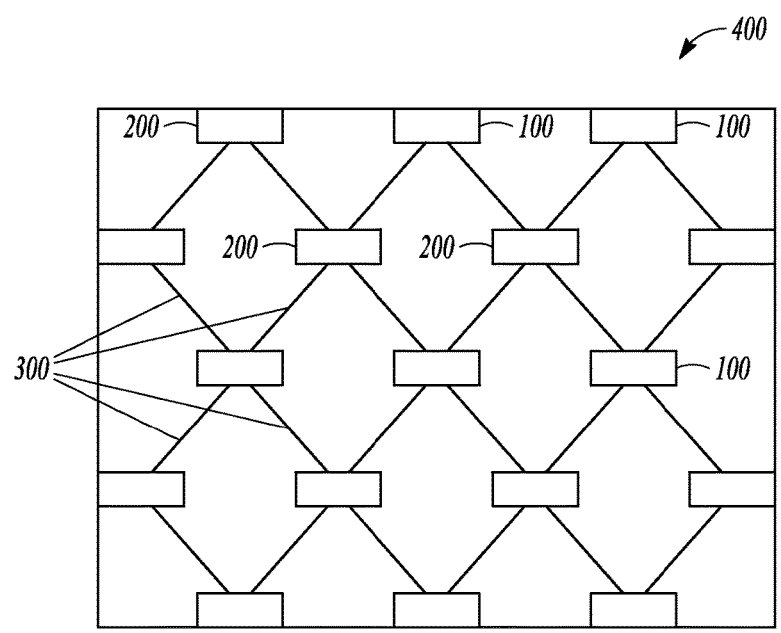
FIG. 4 is a perspective view of one example of a mesh network of linear and/or serpentine piezoelectric harvesters.

FIG. 4 is a perspective view of one example of a mesh network of piezoelectric harvesters. In one example, two or more linear and/or serpentine piezoelectric harvesters 100, 200 are integrated into a mesh network 400 such that each of the two or more linear and/or serpentine piezoelectric harvesters 100, 200 are electrically connected to each other (e.g., through the use of conductors 300). The integration of the two or more linear and/or serpentine piezoelectric harvesters 100, 200 into a mesh network 400 can allow for a larger amount of energy to be harvested by increasing the density of piezoelectric harvesters within a given area. Additionally, the fabrication of a mesh network 400 can allow for energy to be harvested from one of the linear and/or serpentine piezoelectric harvesters 100, 200 while the other linear and/or serpentine piezoelectric harvesters 100, 200 of the mesh network 400 do not produce an electrical output. Stated another way, the creation of a mesh network 400 by electrically coupling two or more linear and/or serpentine piezoelectric harvesters 100, 200 can allow for more efficient energy harvesting by increasing the amount of piezoelectric harvesters per unit area. Alternatively or additionally, the creation of a mesh network 400 by electrically coupling two or more linear and/or serpentine piezoelectric harvesters 100, 200 can allow for a larger area of the piece of fabric 140 to be covered in linear and/or serpentine piezoelectric harvesters 100, 200 thereby improving the flexibility or stretchability of the piece of fabric 140.

In another example, the mesh network 400 is in electrical communication with one or more energy storage mediums 310. The mesh network 400 is capable of generating electricity from the one or more linear and/or serpentine piezoelectric harvesters 100, 200 and supplying that harvested energy (e.g., through the use of the conductors 300) to one or more energy storage mediums 310. The energy stored within the energy storage mediums 310 is available to supply power to one or more electronic devices 320. In yet another example, the one or more energy storage mediums 310 are located remotely from the linear and/or serpentine piezoelectric harvester 100, 200.

In yet another example, the mesh network 400 is fabricated through the use of a piezoelectric ink. Piezoelectric ink is applied to a substrate (e.g., the piece of fabric 140) such that a linear or serpentine piezoelectric harvester 100, 200 is created at the locations where the piezoelectric ink has been applied. The fabrication of linear or serpentine piezoelectric harvesters 100, 200 through the use of piezoelectric inks is advantageous, among other things, because it allows for complex or unique shapes to be created. Additionally, the use of piezoelectric inks is advantageous, among other things, because it allows for a wide range of sizes of linear or serpentine piezoelectric harvesters 100, 200 to be created. Further, the use of piezoelectric inks is advantageous, among other things, because it simplifies the creation of linear or serpentine piezoelectric harvesters 100, 200 on clothing. Additionally, the use of piezoelectric inks on clothing can increase the utility of clothing by, among other things, having emblems and other graphics that would otherwise be printed on the clothing to also generate electricity through the use of one or more linear and/or serpentine piezoelectric harvesters 100, 200 or the mesh network 400. In one example, the piezoelectric ink can be applied to an intermediate substrate (not shown) that is then integrated into the piece of fabric 140.

Figure 5:
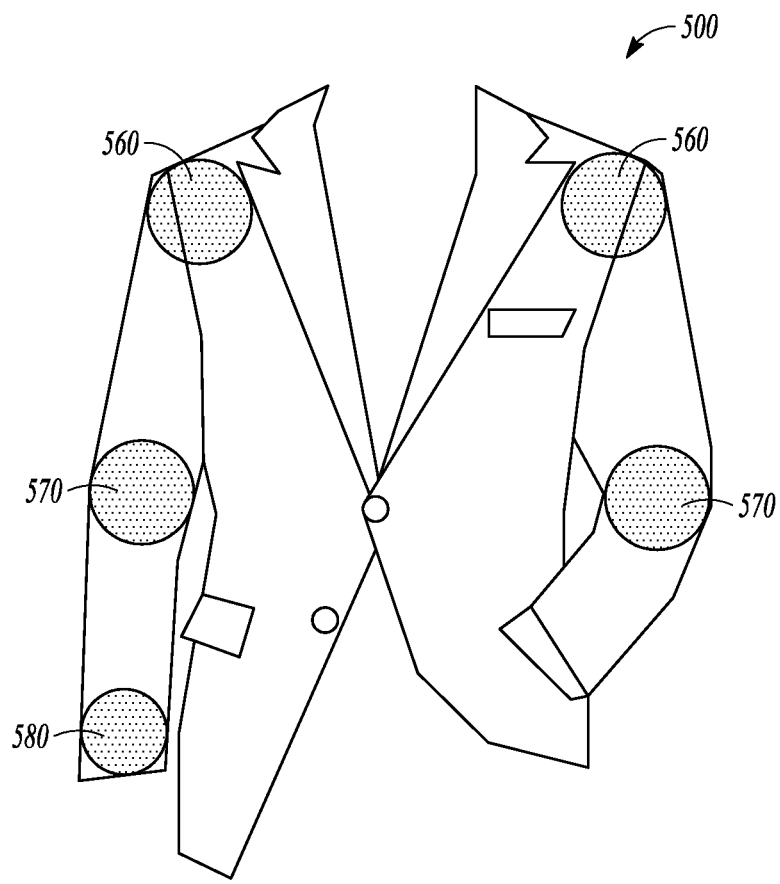
FIG. 5 is a perspective view of one example of locations where a mesh network of piezoelectric harvesters can be located in a fabric-based wearable electronic device.

FIG. 5 is a perspective view of one example of locations where a mesh network 400 of piezoelectric harvesters can be located in a fabric-based wearable electronic device. In an example, and as previously described herein, one or more linear and/or serpentine piezoelectric harvesters 100, 200 can be coupled to the piece of fabric 140. In another example, the mesh network 400 can be coupled to the piece of fabric 140. In yet another example, the piece of fabric 140 is a piece of clothing. In still yet another example, the piece of clothing is a jacket 500, pants 510, shirt, shoes, socks, hat, underwear, or the like.

Additionally, in an example, the one or more linear or serpentine piezoelectric harvesters 100, 200 or the mesh network 400 are coupled to the piece of fabric 140 at locations that substantially corresponds with the portions of the piece of fabric 140 that will be moving. Stated another way, the one or more linear and/or serpentine piezoelectric harvesters 100, 200 are aligned in a direction that is at a particular angle relative to the movement of the piece of fabric 140. In another example, the one or more linear and/or serpentine piezoelectric harvesters 100, 200 or the mesh network 400 are coupled to the clothing at locations that substantially correspond with the joints of the human body. Stated another way, the one or more linear or serpentine piezoelectric harvesters 100, 200 or the mesh network 400 are coupled to the piece of clothing at locations that correspond to the location of the joints of the living organism wearing the piece of clothing. In yet another example the joints are selected from the group consisting of ankles, knees, hips, shoulders 560, elbows 570, and wrists 580.

Further, in an example, the one or more linear or serpentine piezoelectric harvesters 100, 200 or the mesh network 400 are coupled to the piece of fabric 140 such that the linear and/or serpentine piezoelectric harvesters 100, 200 are aligned in a direction that is at a particular angle relative to the movement of the piece of fabric 140. In another example with the piece of fabric 140 being a flag, the linear or serpentine piezoelectric harvesters 100, 200 are aligned longitudinally along the flag such that the one or more linear or serpentine piezoelectric harvesters 100, 200 experience the maximum amount of strain as the flag flaps in the wind, and therefore generate the maximum amount of energy available.

In yet another example with the piece of fabric 140 being a jacket 500, the one or more linear or serpentine piezoelectric harvesters 100, 200 or the mesh network 400 are coupled to the jacket 500 in the area surrounding the elbows 570. The one or more linear or serpentine piezoelectric harvesters 100, 200 or the mesh network 400 are aligned with the movement of the elbows 570 such that when the living organism wearing the jacket 510 bends its elbow, the one or more linear or serpentine piezoelectric harvesters 100, 200 or the mesh network 400 experience more strain than if the one or more linear or serpentine piezoelectric harvesters 100, 200 or the mesh network 400 were not aligned with the movement of the elbows 570.

In still yet another example, with the piece of fabric 140 being fabricated into a tent, the one or more linear or serpentine piezoelectric harvesters 100, 200 or the mesh network 400 are incorporated into the flysheet (i.e., rain fly), groundsheet, and/or the sides (i.e., the exterior surfaces) of the tent. The flysheet and sides can generate electricity when exposed to wind or other outside forces (e.g., a person manipulating the door to the tent or rain). Additionally, the groundsheet can generate electricity when stepped on by an individual in the tent. In an example, the energy harvested by the one or more linear or serpentine piezoelectric harvesters 100, 200 or the mesh network 400 is used to power a light that is coupled with the tent.

Still further, in an example, the one or more linear or serpentine piezoelectric harvesters 100, 200, or the one or more linear or serpentine piezoelectric harvesters 100, 200 of the mesh network 400 can be oriented such that one or more linear or serpentine piezoelectric harvesters 100, 200 or the mesh network 400 are able to harvest the energy resulting from a compound motion. In one example, the orientation of the one or more linear or serpentine piezoelectric harvesters 100, 200 of the mesh network 400 are offset from one another (e.g., at 90 degrees) such that some of the one or more linear or serpentine piezoelectric harvesters 100, 200 of the mesh network 400 experience strain in one plane of movement while other linear or serpentine piezoelectric harvesters 100, 200 of the mesh network 400 experience no strain in that same plane of movement.

Stated another way, the one or more linear or serpentine piezoelectric harvesters 100, 200 or the one or more linear or serpentine piezoelectric harvesters 100, 200 of the mesh network 400 can be oriented such that some of the one or more linear or serpentine piezoelectric harvesters 100, 200 will experience strain as a result of a first degree of freedom. In another example, the one or more linear or serpentine piezoelectric harvesters 100, 200 or the one or more linear or serpentine piezoelectric harvesters 100, 200 of the mesh network 400 can be oriented such that some of the one or more linear or serpentine piezoelectric harvesters 100, 200 will experience strain as a result of a second degree of freedom. It is intended that the preceding examples will apply to each of the remaining four degrees available to the piece of fabric 140.

In another example, the orientation of the one or more linear or serpentine piezoelectric harvesters 100, 200 of the mesh network 400 are offset from one another (e.g., at 45 degrees) such that some of the one or more linear or serpentine piezoelectric harvesters 100, 200 of the mesh network 400 experience strain in one plane of movement while other linear or serpentine piezoelectric harvesters 100, 200 of the mesh network 400 experience substantially less (e.g., 30 percent less) strain in that same plane of movement.

When some of the linear or serpentine piezoelectric harvesters 100, 200 of the mesh network 400 are offset from one another (e.g., at 45 degrees), this allows for the mesh network 400 to experience strain that it otherwise would not experience and therefore generate electricity that it otherwise would not generate if the mesh network were incapable of being strained due to a compound movement. Stated another way, the one or more linear or serpentine piezoelectric harvesters 100, 200 of the mesh network 400 can be oriented such that the one or more linear or serpentine piezoelectric harvesters 100, 200 of the mesh network 400 efficiently and effectively capture the compound movement of an object (e.g., a person wearing the jacket, or a flag or tent flapping in the wind).

Figure 6:
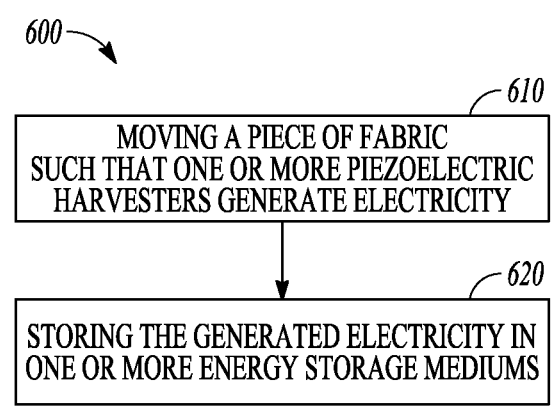
FIG. 6 is a block diagram for a method for harvesting energy from fabric.

FIG. 6 is a block diagram of a method for harvesting energy from a piece of fabric 140. In one example, step 610 involves moving a piece of fabric such that one or more piezoelectric harvesters generate electricity. Step 620 involves storing the generated electricity in one or more energy storage mediums. Alternatively or additionally, the method 600 includes supplying the generated electricity to one or more electronic devices 320. In another example, the method 600 includes generating electricity with the one or more piezoelectric harvesters at locations that substantially correspond with the portions of the fabric that will be moving. Further, the method 600 can include generating electricity at locations where a piezoelectric ink has been applied to the piece of fabric. Still further, the method 600 can include generating electricity from the one or more piezoelectric harvesters that have been aligned in a direction that is at a particular angle relative to the movement of the piece of fabric.

In yet another example, the method 600 includes moving a piece of fabric, wherein the piece of fabric is a piece of clothing. Additionally, the method 600 can include generating electricity with the one or more piezoelectric harvesters at locations that substantially correspond with one or more joints of the human body (e.g., elbows 570). Further, the method 600 can include generating electricity with the one or more piezoelectric harvesters at locations that correspond to the location of a wearers joints, the joints selected from the group consisting of ankles, knees, hips, shoulders, elbows, and wrists. Still further, the method 600 can include generating electricity with the one or more piezoelectric harvesters at locations where a piezoelectric ink has been applied to the piece of clothing.

VARIOUS NOTES & EXAMPLES

Example 1 can include or use a device for harvesting energy from a piece of fabric, including a piece of fabric, one or more piezoelectric harvesters coupled with the piece of fabric, the piezoelectric harvesters capable of producing electric energy in response to the movement of the piece of fabric, and one or more energy storage mediums coupled to the one or more piezoelectric harvesters, the energy storage mediums capable of storing the energy produced by the one or more piezoelectric harvesters.

Example 2 can include or use, or can optionally be combined with the subject matter of Example 1, to optionally include or use coupling of the one or more piezoelectric harvesters to the fabric at locations that substantially correspond with the portions of the fabric that will be moving.

Example 3 can include or use, or can optionally be combined with the subject matter of one or any combination of Examples 1 or 2 to optionally include or use a piezoelectric ink that is applied to the piece of fabric, thereby creating a piezoelectric harvester Example 4 can include or use, or can optionally be combined with the subject matter of one or any combination of Examples 1 through 3 to optionally include or use an electronic device that is coupled to the one or more energy storage mediums, the electronic device drawing power from the one or more energy storage mediums.

Example 5 can include, or can optionally be combined with the subject matter of one or any combination of Examples 1 through 4 to include coupling of the piezoelectric harvesters to the piece of fabric such that the piezoelectric harvesters are aligned in a direction that is at a particular angle relative to the movement of the piece of fabric.

Example 6 can include or use, a device for harvesting energy from clothing including a piece of clothing, one or more piezoelectric harvesters coupled with the piece of clothing, the piezoelectric harvesters capable of producing electric energy in response to the movement of the piece of clothing, and one or more energy storage mediums coupled to the one or more piezoelectric harvesters, the energy storage mediums capable of storing the energy produced by the one or more piezoelectric harvesters.

Example 7 can include or use, or can optionally be combined with the subject matter of Example 6 to optionally include or use one or more piezoelectric harvesters that are coupled to the piece of clothing at locations that substantially correspond with the joints of the human body.

Example 8 can include or use, or can optionally be combined with the subject matter of one or any combination of Examples 6 or 7 to optionally include or use one or more piezoelectric harvesters that are coupled to the piece of clothing at locations that correspond to the location of a wearer's joints, the joints selected from the group consisting of ankles, knees, hips, shoulders, elbows, and wrists.

Example 9 can include or use, or can optionally be combined with the subject matter of one or any combination of Examples 6 through 8 to include or use a piezoelectric ink that is applied to the piece of clothing, thereby creating a piezoelectric harvester.

Example 10 can include or use, or can optionally be combined with the subject matter of one or any combination of Examples 6 through 9 to optionally include or use an electronic device that is coupled to the one or more energy storage mediums, the electronic device drawing power from the one or more energy storage mediums.

Example 11 can include or use a method for harvesting energy from fabric, including moving a piece of fabric such that one or more piezoelectric harvesters generate electricity and storing the generated electricity in one or more energy storage mediums.

Example 12 can include or use, or can optionally be combined with the subject matter of Example 11 to optionally include supplying the generated electricity to one or more electronic devices.

Example 13 can include, or can optionally be combined with the subject matter of Examples 11 or 12 to optionally include generating electricity with the one or more piezoelectric harvesters at locations that substantially correspond with the portions of the fabric that will be moving.

Example 14 can include, or can optionally be combined with the subject matter of one or any combination of Examples 11 through 13 to optionally include generating electricity at locations where a piezoelectric ink has been applied to the piece of fabric.

Example 15 can include, or can optionally be combined with the subject matter of one or any combination of Examples 11 through 14 to optionally include generating electricity from the one or more piezoelectric harvesters that have been aligned in a direction that is at a particular angle relative to the movement of the piece of fabric.

Example 16 can include, or can optionally be combined with the subject matter of one or any combination of Examples 11 through 15 to optionally include that moving the piece of fabric includes moving a piece of clothing.

Example 17 can include, or can optionally be combined with the subject matter of one or any combination of Examples 11 through 16 to optionally include generating electricity with the one or more piezoelectric harvesters at locations that substantially correspond with one or more joints of the human body.

Example 18 can include, or can optionally be combined with the subject matter of one or any combination of Examples 11 through 17 to optionally include generating electricity with the one or more piezoelectric harvesters at locations that correspond to the location of a wearer's joints, the joints selected from the group consisting of ankles, knees, hips, shoulders, elbows, and wrists.

Example 19 can include, or can optionally be combined with the subject matter of one or any combination of Examples 11 through 18 to optionally include generating electricity with the one or more piezoelectric harvesters at locations where a piezoelectric ink has been applied to the piece of clothing.

Example 20 can include, or can optionally be combined with the subject matter of one or any combination of Examples 11 through 19 to optionally include an apparatus including means to perform a method as claimed in any preceding claim.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device for harvesting energy from fabric comprising:
a piece of fabric;
one or more piezoelectric harvesters coupled with the piece of fabric, the piezoelectric harvesters capable of producing electric energy in response to the movement of the piece of fabric, wherein the one or more piezoelectric harvesters include:
a first electrode including a first set of projections,
a second electrode including a second set of projections interleaved with the first set of projections, and
a piezoelectric material positioned between the interleaved portions of the first set of projections and the second set of projections, wherein the piezoelectric material is in communication with the first set of projections and the second set of projections; and
one or more energy storage mediums coupled to the one or more piezoelectric harvesters, the energy storage mediums capable of storing the energy produced by the one or more piezoelectric harvesters.

2. The device of claim 1, wherein the one or more piezoelectric harvesters are coupled to the fabric at locations that substantially correspond with the portions of the fabric that will be moving.

3. The device of claim 1, wherein a piezoelectric ink is applied to the piece of fabric, thereby creating a piezoelectric harvester.

4. The device of claim 1, wherein an electronic device is coupled to the one or more energy storage mediums, the electronic device drawing power from the one or more energy storage mediums.

5. The device of claim 1, wherein the piezoelectric harvesters are coupled to the piece of fabric such that the piezoelectric harvesters are aligned in a direction that is at a particular angle relative to the movement of the piece of fabric.

6. A device for harvesting energy from clothing comprising:
- a piece of clothing;
- one or more piezoelectric harvesters coupled with the piece of clothing, the piezoelectric harvesters capable of producing electric energy in response to the movement of the piece of clothing, wherein the one or more piezoelectric harvesters include:
  - a first electrode including a first set of projections,
  - a second electrode including a second set of projections interleaved with the first set of projections, and
  - a piezoelectric material positioned between the interleaved portions of the first set of projections and the second set of projections, wherein the piezoelectric material is in communication with the first set of projections and the second set of projections; and
- one or more energy storage mediums coupled to the one or more piezoelectric harvesters, the energy storage mediums capable of storing the energy produced by the one or more piezoelectric harvesters.

7. The device of claim 6, wherein the one or more piezoelectric harvesters are coupled to the piece of clothing at locations that substantially correspond with the joints of the human body.

8. The device of claim 6, wherein the one or more piezoelectric harvesters are coupled to the piece of clothing at locations that correspond to the location of a wearer's joints, the joints selected from the group consisting of ankles, knees, hips, shoulders, elbows, and wrists.

9. The device of claim 6, wherein a piezoelectric ink is applied to the piece of clothing, thereby creating a piezoelectric harvester.

10. The device of claim 6, wherein an electronic device is coupled to the one or more energy storage mediums, the electronic device drawing power from the one or more energy storage mediums.

11. A method for harvesting energy from fabric comprising:
- moving a piece of fabric such that one or more piezoelectric harvesters generate electricity;
- storing the generated electricity in one or more energy storage mediums; and
- wherein the one or more piezoelectric harvesters include:
  - a first electrode including a first set of projections,
  - a second electrode including a second set of projections interleaved with the first set of projections, and
  - a piezoelectric material positioned between the interleaved portions of the first set of projections and the second set of projections, wherein the piezoelectric material is in communication with the first set of projections and the second set of projections.

12. The method of claim 11, wherein the method includes supplying the generated electricity to one or more electronic devices.

13. The method of claim 11, wherein the method includes generating electricity with the one or more piezoelectric harvesters at locations that substantially correspond with the portions of the fabric that will be moving.

14. The method of claim 11, wherein the method includes generating electricity at locations where a piezoelectric ink has been applied to the piece of fabric.

15. The method of claim 11, wherein the method includes generating electricity from the one or more piezoelectric harvesters that have been aligned in a direction that is at a particular angle relative to the movement of the piece of fabric.

16. The method of claim 11, wherein moving the piece of fabric includes moving a piece of clothing.

17. The method of claim 16, wherein the method includes generating electricity with the one or more piezoelectric harvesters at locations that substantially correspond with one or more joints of the human body.

18. The method of claim 16, wherein the method includes generating electricity with the one or more piezoelectric harvesters at locations that correspond to the location of a wearer's joints, the joints selected from the group consisting of ankles, knees, hips, shoulders, elbows, and wrists.

19. The method of claim 16, wherein the method includes generating electricity with the one or more piezoelectric harvesters at locations where a piezoelectric ink has been applied to the piece of clothing.

* * * * *

UNITED STATES PATENT AND TRADEMARK OFFICE
CERTIFICATE OF CORRECTION

PATENT NO. : 10,215,164 B2  
APPLICATION NO. : 14/961116  
DATED : February 26, 2019  
INVENTOR(S) : Dabby et al.

Page 1 of 1

It is certified that error appears in the above-identified patent and that said Letters Patent is hereby corrected as shown below:

On the Title Page

On page 2, in Column 2, Item (56) under "Other Publications", Line 23, before "filed", insert --Response--

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*